United States Patent
Yang

(10) Patent No.: US 9,648,781 B2
(45) Date of Patent: May 9, 2017

(54) TEMPERATURE EQUALIZATION APPARATUS JETTING FLUID FOR THERMAL CONDUCTION USED IN ELECTRICAL EQUIPMENT

(76) Inventor: Tai-Her Yang, Dzan-Hwa (TW)

( * ) Notice: Subject to any disclaimer, the term of this patent is extended or adjusted under 35 U.S.C. 154(b) by 1279 days.

(21) Appl. No.: 13/367,432

(22) Filed: Feb. 7, 2012

(65) Prior Publication Data

US 2012/0205076 A1    Aug. 16, 2012

Related U.S. Application Data

(63) Continuation-in-part of application No. 13/025,337, filed on Feb. 11, 2011.

(51) Int. Cl.
*F28D 15/00* (2006.01)
*H05K 7/20* (2006.01)
*H01L 23/473* (2006.01)

(52) U.S. Cl.
CPC ..... *H05K 7/20345* (2013.01); *H01L 23/4735* (2013.01); *H05K 7/20381* (2013.01); *H01L 2924/0002* (2013.01)

(58) Field of Classification Search
CPC .............. H01L 23/4735; H05K 7/203; H05K 7/20345; H05K 7/2029; H05K 7/20327
USPC .............. 165/104.11, 104.19, 104.21, 14.28, 165/104.31, 908
See application file for complete search history.

(56) References Cited

U.S. PATENT DOCUMENTS

| | | | | |
|---|---|---|---|---|
| 4,352,392 A * | 10/1982 | Eastman | ................ | F28D 15/04 165/104.25 |
| 4,897,762 A * | 1/1990 | Daikoku | ............ | H01L 23/4735 165/80.4 |
| 7,043,933 B1 * | 5/2006 | Knight | ................ | H01L 23/4735 257/E23.1 |
| 7,308,801 B1 * | 12/2007 | Tilton | ................ | G01R 31/2874 257/E23.1 |
| 7,815,173 B2 * | 10/2010 | Lin | .......................... | F28D 3/02 165/104.32 |
| 2009/0188651 A1 * | 7/2009 | Lin | .......................... | F28C 1/14 165/104.28 |
| 2009/0205802 A1 * | 8/2009 | Yoshida | .............. | H01L 23/4735 165/41 |
| 2010/0200210 A1 * | 8/2010 | Gian | ........................ | F24J 3/081 165/247 |
| 2011/0036100 A1 * | 2/2011 | Sedlak | .................. | F04D 29/284 62/6 |

* cited by examiner

*Primary Examiner* — Len Tran
*Assistant Examiner* — Claire RoJohn, III
(74) *Attorney, Agent, or Firm* — Bacon & Thomas, PLLC

(57) ABSTRACT

The present invention discloses an external thermal conduction interface structure of electrical equipment wherein a fluid jetting device is utilized to jet a thermal conductive fluid for exchanging heat with the external thermal conduction interface structure of electrical equipment via the thermal energy of the jetted thermal conductive fluid, the heat exchange means includes the external thermal conduction interface structure of electrical equipment having relative high temperature being cooled by a fluid have relative lower temperature, and external thermal conduction interface structure of electrical equipment having relative lower temperature being heated by a fluid having relative higher temperature.

21 Claims, 8 Drawing Sheets

United States Patent (US 9,648,781 B2)

TEMPERATURE EQUALIZATION APPARATUS JETTING FLUID FOR THERMAL CONDUCTION USED IN ELECTRICAL EQUIPMENT

CROSS-REFERENCE TO RELATED APPLICATION

This application is a Continuation-In-Part of my patent application Ser. No. 13/025,337, filed on Feb. 11, 2011.

BACKGROUND OF THE INVENTION (a) Field of the Invention

The present invention discloses an external thermal conduction interface structure of electrical equipment (101) wherein a fluid jetting device (103) is utilized to jet a thermal conductive fluid (104) for exchanging heat with the external thermal conduction interface structure of electrical equipment (101) via the thermal energy of the jetted thermal conductive fluid (104), the heat exchange means includes the external thermal conduction interface structure of electrical equipment (101) having relative high temperature being cooled by a fluid having relative lower temperature, and the external thermal conduction interface structure of electrical equipment (101) having relative lower temperature being heated by a fluid having relative higher temperature;

According to the present invention, the fluid jetted by the fluid jetting device (103) includes the thermal conductive fluid (104) in a liquid state or in a particle liquid or mist or gaseous state, or the thermal conductive fluid (104) capable of converting into a gaseous state from a liquid state or converting into a liquid state from a gaseous state, and a fluid collecting basin (105) is installed for collecting the returned fluid which is jetted to the external thermal conduction interface structure of electrical equipment (101), so as to form a circulative operation of the thermal conductive fluid (104), and the thermal conductive fluid (104) and the fluid collecting basin (105) can be served as interfaces for performing temperature equalizing and regulating to the exterior;

The fluid jetting device (103) of the present invention injects the fluid through the fluid jetting device (103) in a small particle or fine mist state to the external thermal conduction interface structure of electrical equipment (101), such that the fluid in the small particle or fine mist state is enabled to be accelerated for being injected to the surface of the external thermal conduction interface structure of electrical equipment (101) thereby being diffused to films and evaporated, and forcing the gaseous fluid, which has already been evaporated, to be away from the surface of the external thermal conduction interface structure of electrical equipment (101); or a dry-expansion type evaporator, or a flooded type evaporator, or a spray type evaporator, or a falling type evaporator is installed to the external thermal conduction interface structure of electrical equipment (101), so as to constitute temperature equalization operating function of the external thermal conduction interface structure of electrical equipment (101).

(b) Description of the Prior Art

The temperature maintaining, cooling or heating for conventional electrical equipment often needs active temperature regulating devices for temperature maintaining, cooling or heating, the disadvantages thereof are higher installation cost and consuming greater energy in operation.

SUMMARY OF THE INVENTION

The present invention provides a temperature equalization apparatus jetting fluid for thermal conduction used in an electrical equipment, wherein a thermal conductive fluid (104) is jetted to an external thermal conduction interface structure of electrical equipment (101) through a fluid jetting device (103) then returned to a fluid collecting basin (105) for forming a circulation, and the thermal conductive fluid (104) and the fluid collecting basin (105) can be served as interfaces for performing temperature equalizing and regulating to the exterior, and 1. The thermal conductive fluid (104) in the fluid collecting basin (105) is introduced via a fluid inlet of the fluid jetting device (103) so as to be jetted to the external thermal conduction interface structure of electrical equipment (101), then the thermal conductive fluid (104) is returned to the fluid collecting basin (105) for forming the circulation of the thermal conductive fluid (104), and a housing of the fluid collecting basin (105) is served to perform temperature equalizing and regulating to the exterior;

2. The thermal conductive fluid (104) in the outlet of a pipeline (108) of a temperature equalizing device (102) installed in a natural thermal energy body (200) is directly introduced through a fluid introducing pipe (1031) of the fluid jetting device (103) so as to be jetted to the external thermal conduction interface structure of electrical equipment (101), then the thermal conductive fluid (104) is returned to the fluid collecting basin (105), as well as passed through the temperature equalizing device (102) installed in the natural thermal energy body (200), so as to enable the thermal conductive fluid (104) to perform temperature equalizing and regulating with the natural thermal energy body (200) through the temperature equalizing device (102), then returned to the fluid inlet of the fluid jetting device thereby forming the circulation of the thermal conductive fluid (104);

3. The thermal conductive fluid (104) in the fluid collecting basin (105) is introduced via the fluid inlet of the fluid jetting device (103) so as to be jetted to the external thermal conduction interface structure of electrical equipment (101), then the thermal conductive fluid (104) is returned to the fluid collecting basin (105); a fluid pump (106) and a pipeline (108) are installed between the fluid collecting basin (105) and the temperature equalizing device (102) installed in the natural thermal energy body (200), the thermal conductive fluid (104) in the fluid collecting basin (105) is pumped by the fluid pump (106) to pass through the temperature equalizing device (102) installed in the natural thermal energy body (200) via the pipeline (108), thereby to enable the thermal conductive fluid (104) to perform temperature equalizing and regulating with the natural thermal energy body (200) through the temperature equalizing device (102), then returned to the fluid collecting basin (105) thereby forming the circulation of the thermal conductive fluid (104);

4. The thermal conductive fluid (104) in the fluid collecting basin (105) is introduced via the fluid inlet of the fluid jetting device (103) so as to be jetted to the external thermal conduction interface structure of electrical equipment (101), then the thermal conductive fluid (104) is returned to the fluid collecting basin (105) thereby forming the circulation of the thermal conductive fluid (104);

and a heat exchanging device (120) immersed in the thermal conductive fluid (104) of the fluid collecting basin (105) is installed, the thermal conductive fluid (104) in the thermal exchanging device (120) is pumped by a fluid pump (106) installed at the fluid outlet of the heat exchanging device (120) and passed through the temperature equalizing device (102) installed in the natural thermal energy body (200) via the pipeline (108), then returned to the heat exchanging device (120) through the fluid inlet of the heat exchanging device (120), so as to form the circulation of the thermal conductive fluid (104) between the heat exchanging device (120) and the temperature equalizing device (102), as well as to enable the thermal conductive fluid (104) to perform temperature equalizing and regulating with the natural thermal energy body (200) through the temperature equalizing device (102);

5. A relay heat exchanging device (121) is installed between the fluid collecting basin (105) and the temperature equalizing device (102), a fluid inlet at the primary side of the relay heat exchanging device (121) is communicated to the fluid collecting basin (105), the system operation is that the thermal conductive fluid (104) in a fluid outlet at the primary side of the relay heat exchanging device (121) is directly introduced through the fluid introducing pipe (1031) of the fluid jetting device (103) so as to be jetted to the external thermal conduction interface structure of electrical equipment (101), then the thermal conductive fluid (104) is returned to the fluid collecting basin (105) and further flowed to the fluid inlet at the primary side of the relay heat exchanging device (121), thereby forming the circulation of the thermal conductive fluid (104) at the primary side of the relay heat exchanging device (121); and a fluid pump (106) is installed between a fluid inlet and a fluid outlet at the secondary side of the relay heat exchanging device (121) and the temperature equalizing device (102) installed in the natural thermal energy body (200) for pumping the thermal conduction fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

6. A relay heat exchanging device (121) is installed between the fluid collecting basin (105) and the temperature equalizing device (102), and the system operation is that the thermal conductive fluid (104) in the fluid collecting basin (105) is introduced through the fluid inlet of the fluid jetting device (103) so as to be jetted to the external thermal conduction interface structure of electrical equipment (101), then the thermal conductive fluid (104) is returned to the fluid collecting basin (105) for forming the circulation of the thermal conductive fluid (104); a fluid pump (1061) and a pipeline (108) are installed between the fluid outlet at the primary side of the relay heat exchanging device (121) and the fluid collecting basin (105) for pumping the thermal conductive fluid (104) at the primary side to return to the fluid collecting basin (105) via the pipeline (108) so as to form the circulation of the thermal conductive fluid (104) at the primary side; a fluid pump (106) is installed between the fluid inlet and the fluid outlet at the secondary side of the relay heat exchanging device (121) and the temperature equalizing device (102) installed in the natural thermal energy body (200) for pumping the thermal conductive fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

The mentioned natural thermal energy body (200) can be a thermal storage member such as an earth surface, stratum, river, lake, artificial water channel or pipeline or pond.

DESCRIPTION OF MAIN COMPONENT SYMBOLS

Figure 1:
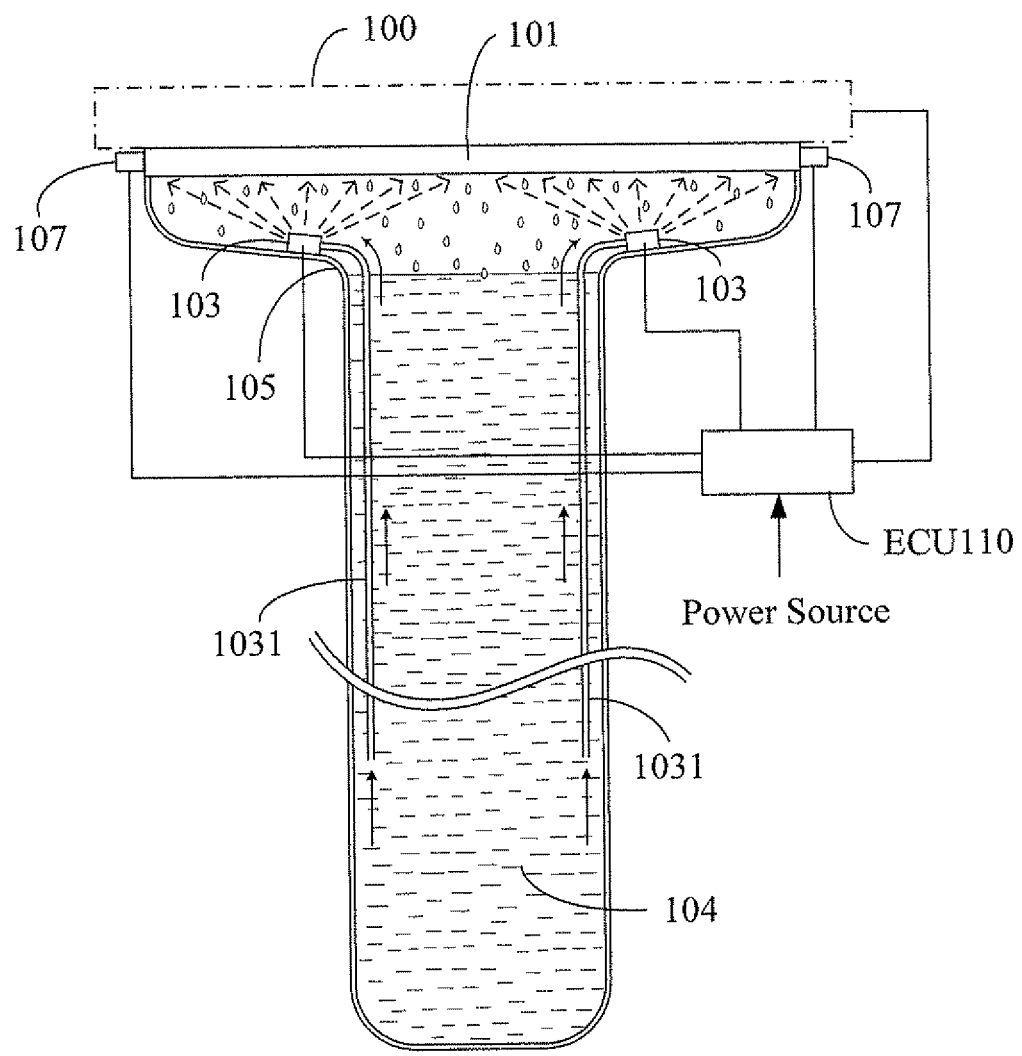
FIG. 1 is a schematic structural view showing the operation of the fluid collecting basin (105) dissipating heat to the exterior, according to the present invention.

100: Electric equipment
101: External thermal conduction interface structure of electrical equipment
102: Temperature equalizing device
103: Fluid jetting device
104: Thermal conductive fluid
105: Fluid collecting basin
106 1061: Fluid pump
107: Temperature detecting device
108: Pipeline
120: Heat exchanging device
121: Relay heat exchanging device
1031: Fluid introducing pipe
ECU110: Control unit
200: Natural thermal energy body

DETAILED DESCRIPTION OF THE PREFERRED EMBODIMENTS

The present invention discloses an external thermal conduction interface structure of electrical equipment (101) wherein a fluid jetting device (103) is utilized to jet a thermal conductive fluid (104) for exchanging heat with the external thermal conduction interface structure of electrical equipment (101) via the thermal energy of the jetted thermal conductive fluid (104), the heat exchange means includes the external thermal conduction interface structure of electrical equipment (101) having relative high temperature being cooled by a fluid having relative lower temperature, and the external thermal conduction interface structure of electrical equipment (101) having relative lower temperature being heated by a fluid having relative higher temperature;

According to the present invention, the fluid jetted by the fluid jetting device (103) includes the thermal conductive fluid (104) in a liquid state or in a particle liquid or mist or gaseous state, or the thermal conductive fluid (104) capable of converting into a gaseous state from a liquid state or converting into a liquid state from a gaseous state, and a fluid collecting basin (105) is installed for collecting the returned fluid which is jetted to the external thermal conduction interface structure of electrical equipment (101), so as to form a circulative operation of the thermal conductive fluid (104), and the thermal conductive fluid (104) and the fluid collecting basin (105) can be served as interfaces for performing temperature equalizing and regulating to the exterior;

The fluid jetting device (103) of the present invention injects the fluid through the fluid jetting device (103) in a small particle or fine mist state to the external thermal conduction interface structure of electrical equipment (101), such that the fluid in the small particle or fine mist state is enabled to be accelerated for being injected to the surface of the external thermal conduction interface structure of electrical equipment (101) thereby being diffused to films and evaporated, and forcing the gaseous fluid, which has already been evaporated, to be away from the surface of the external thermal conduction interface structure of electrical equipment (101); or a dry-expansion type evaporator, or a flooded type evaporator, or a spray type evaporator, or a falling type evaporator is installed to the external thermal conduction interface structure of electrical equipment (101), so as to constitute temperature equalization operating function of the external thermal conduction interface structure of electrical equipment (101).

The present invention provides a temperature equalization apparatus jetting fluid for thermal conduction used in an electrical equipment, wherein a thermal conductive fluid (104) is jetted to an external thermal conduction interface structure of electrical equipment (101) through a fluid jetting device (103) then returned to a fluid collecting basin (105) for forming a circulation, and the thermal conductive fluid (104) and the fluid collecting basin (105) can be served as interfaces for performing temperature equalizing and regulating to the exterior, and the conduction structure of the thermal conductive fluid (104) performing temperature equalizing and regulating to the exterior includes one or more than one of the following means:

1. The thermal conductive fluid (104) in the fluid collecting basin (105) is introduced via a fluid inlet of the fluid jetting device (103) so as to be jetted to the external thermal conduction interface structure of electrical equipment (101), then the thermal conductive fluid (104) is returned to the fluid collecting basin (105) for forming the circulation of the thermal conductive fluid (104), and a housing of the fluid collecting basin (105) is served to perform temperature equalizing and regulating to the exterior;

2. The thermal conductive fluid (104) in the outlet of a pipeline (108) of a temperature equalizing device (102) installed in a natural thermal energy body (200) is directly introduced through a fluid introducing pipe (1031) of the fluid jetting device (103) so as to be jetted to the external thermal conduction interface structure of electrical equipment (101), then the thermal conductive fluid (104) is returned to the fluid collecting basin (105), as well as passed through the temperature equalizing device (102) installed in the natural thermal energy body (200), so as to enable the thermal conductive fluid (104) to perform temperature equalizing and regulating with the natural thermal energy body (200) through the temperature equalizing device (102), then returned to the fluid inlet of the fluid jetting device thereby forming the circulation of the thermal conductive fluid (104);

3. The thermal conductive fluid (104) in the fluid collecting basin (105) is introduced via the fluid inlet of the fluid jetting device (103) so as to be jetted to the external thermal conduction interface structure of electrical equipment (101), then the thermal conductive fluid (104) is returned to the fluid collecting basin (105); a fluid pump (106) and a pipeline (108) are installed between the fluid collecting basin (105) and the temperature equalizing device (102) installed in the natural thermal energy body (200), the thermal conductive fluid (104) in the fluid collecting basin (105) is pumped by the fluid pump (106) to pass through the temperature equalizing device (102) installed in the natural thermal energy body (200) via the pipeline (108), thereby to enable the thermal conductive fluid (104) to perform temperature equalizing and regulating with the natural thermal energy body (200) through the temperature equalizing device (102), then returned to the fluid collecting basin (105) thereby forming the circulation of the thermal conductive fluid (104);

4. The thermal conductive fluid (104) in the fluid collecting basin (105) is introduced via the fluid inlet of the fluid jetting device (103) so as to be jetted to the external thermal conduction interface structure of electrical equipment (101), then the thermal conductive fluid (104) is returned to the fluid collecting basin (105) thereby forming the circulation of the thermal conductive fluid (104); and a heat exchanging device (120) immersed in the thermal conductive fluid (104) of the fluid collecting basin (105) is installed, the thermal conductive fluid (104) in the thermal exchanging device (120) is pumped by a fluid pump (106) installed at the fluid outlet of the heat exchanging device (120) and passed through the temperature equalizing device (102) installed in the natural thermal energy body (200) via the pipeline (108), then returned to the heat exchanging device (120) through the fluid inlet of the heat exchanging device (120), so as to form the circulation of the thermal conductive fluid (104) between the heat exchanging device (120) and the temperature equalizing device (102), as well as to enable the thermal conductive fluid (104) to perform temperature equalizing and regulating with the natural thermal energy body (200) through the temperature equalizing device (102);

5. A relay heat exchanging device (121) is installed between the fluid collecting basin (105) and the temperature equalizing device (102), a fluid inlet at the primary side of the relay heat exchanging device (121) is communicated to the fluid collecting basin (105), the system operation is that the thermal conductive fluid (104) in a fluid outlet at the primary side of the relay heat exchanging device (121) is directly introduced through the fluid introducing pipe (1031) of the fluid jetting device (103) so as to be jetted to the external thermal conduction interface structure of electrical equipment (101), then the thermal conductive fluid (104) is returned to the fluid collecting basin (105) and further flowed to the fluid inlet at the primary side of the relay heat exchanging device (121), thereby forming the circulation of the thermal conductive fluid (104) at the primary side of the relay heat exchanging device (121); and a fluid pump (106) is installed between a fluid inlet and a fluid outlet at the secondary side of the relay heat exchanging device (121) and the temperature equalizing device (102) installed in the natural thermal energy body (200) for pumping the thermal conduction fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

6. A relay heat exchanging device (121) is installed between the fluid collecting basin (105) and the temperature equalizing device (102), and the system operation is that the thermal conductive fluid (104) in the fluid collecting basin (105) is introduced through the fluid inlet of the fluid jetting device (103) so as to be jetted to the external thermal conduction interface structure of electrical equipment (101), then the thermal conductive fluid (104) is returned to the fluid collecting basin (105) for forming the circulation of the thermal conductive fluid (104); a fluid pump (1061) and a pipeline (108) are installed between the fluid outlet at the primary side of the relay heat exchanging device (121) and the fluid collecting basin (105) for pumping the thermal conductive fluid (104) at the primary side to return to the fluid collecting basin (105) via the pipeline (108) so as to form the circulation of the thermal conductive fluid (104) at the primary side; a fluid pump (106) is installed between the fluid inlet and the fluid outlet at the secondary side of the relay heat exchanging device (121) and the temperature equalizing device (102) installed in the natural thermal energy body (200) for pumping the thermal conductive fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

The mentioned natural thermal energy body (200) can be a thermal storage member such as an earth surface, stratum, river, lake, artificial water channel or pipeline or pond.

According to the present invention, a thermal conductive fluid (104) is jetted to an external thermal conduction interface structure of electrical equipment (101) through a fluid jetting device (103) then returned to a fluid collecting basin (105) for forming a circulation, and the thermal conductive fluid (104) and the fluid collecting basin (105) are served as interfaces for performing temperature equalizing and regulating to the exterior, and the conduction structure of the thermal conductive fluid (104) performing temperature equalizing and regulating to the exterior is as following:

According to the temperature equalization apparatus jetting fluid for thermal conduction used in an electrical equipment of the present invention, the thermal conductive fluid (104) in the fluid collecting basin (105) is introduced through a fluid inlet of the fluid jetting device (103) so as to be jetted to the external thermal conduction interface structure of electrical equipment (101), then the thermal conductive fluid (104) is returned to the fluid collecting basin (105) thereby forming the circulation of the thermal conductive fluid (104), and a housing of the fluid collecting basin (105) is served to perform temperature equalizing and regulating to the exterior;

FIG. 1 is a schematic structural view showing the operation of the fluid collecting basin (105) dissipating heat to the exterior, according to the present invention;

As shown in FIG. 1, it mainly consists of:

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Fluid jetting device (103): constituted by one or more than one of fluid jetting devices being installed between the external thermal conduction interface structure of electrical equipment (101) and the fluid collecting basin (105), the fluid jetting device (103) is served to introduce the thermal conductive fluid (104) of the fluid collecting basin (105) through a fluid introducing pipe (1031) then jet the thermal conductive fluid (104) to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for collecting the returned thermal conductive fluid (104) which is jetted by the fluid jetting device (103) to the external thermal conduction interface structure of electrical equipment (101), and by means of the housing of the fluid collecting basin (105) or the fluid received in the basin to conduct thermal energy to the exterior; the structure between the fluid collecting basin (105) and the electric equipment (100) includes an opened, semi-opened or sealed structure;

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pump (106) and the system operation; the function thereof is to control the operating timing of the fluid jetting device (103) for jetting the thermal conductive fluid (104) and the flow rate of the jetted thermal conductive fluid (104) according to the temperature detecting signals of the temperature detecting device (107) and the set system temperature values, thereby to enable the system being operated within the set temperature range; and when the system temperature is abnormal, the system is controlled to reduce the load of the electric equipment (100) or terminate the power supply.

According to the temperature equalization apparatus jetting fluid for thermal conduction used in an electrical equipment of the present invention, the conduction structure of the thermal conductive fluid (104) performing thermal conduction to the exterior can be further constructed by that the thermal conductive fluid (104) in the outlet of a pipeline (108) of a temperature equalizing device (102) installed in a natural thermal energy body (200) is directly introduced through the fluid introducing pipe (1031) of the fluid jetting device (103) so as to be jetted to the external thermal conduction interface structure of electrical equipment (101), then the thermal conductive fluid (104) is returned to the fluid collecting basin (105), as well as passed through the temperature equalizing device (102) installed in the natural thermal energy body (200), so as to enable the thermal conductive fluid (104) to perform temperature equalizing and regulating with the natural thermal energy body (200) through the temperature equalizing device (102), then returned to the fluid inlet of the fluid jetting device thereby forming the circulation of the thermal conductive fluid (104);

The mentioned natural thermal energy body (200) can be a thermal storage member such as an earth surface, stratum, river, lake, artificial water channel or pipeline or pond.

Figure 2:
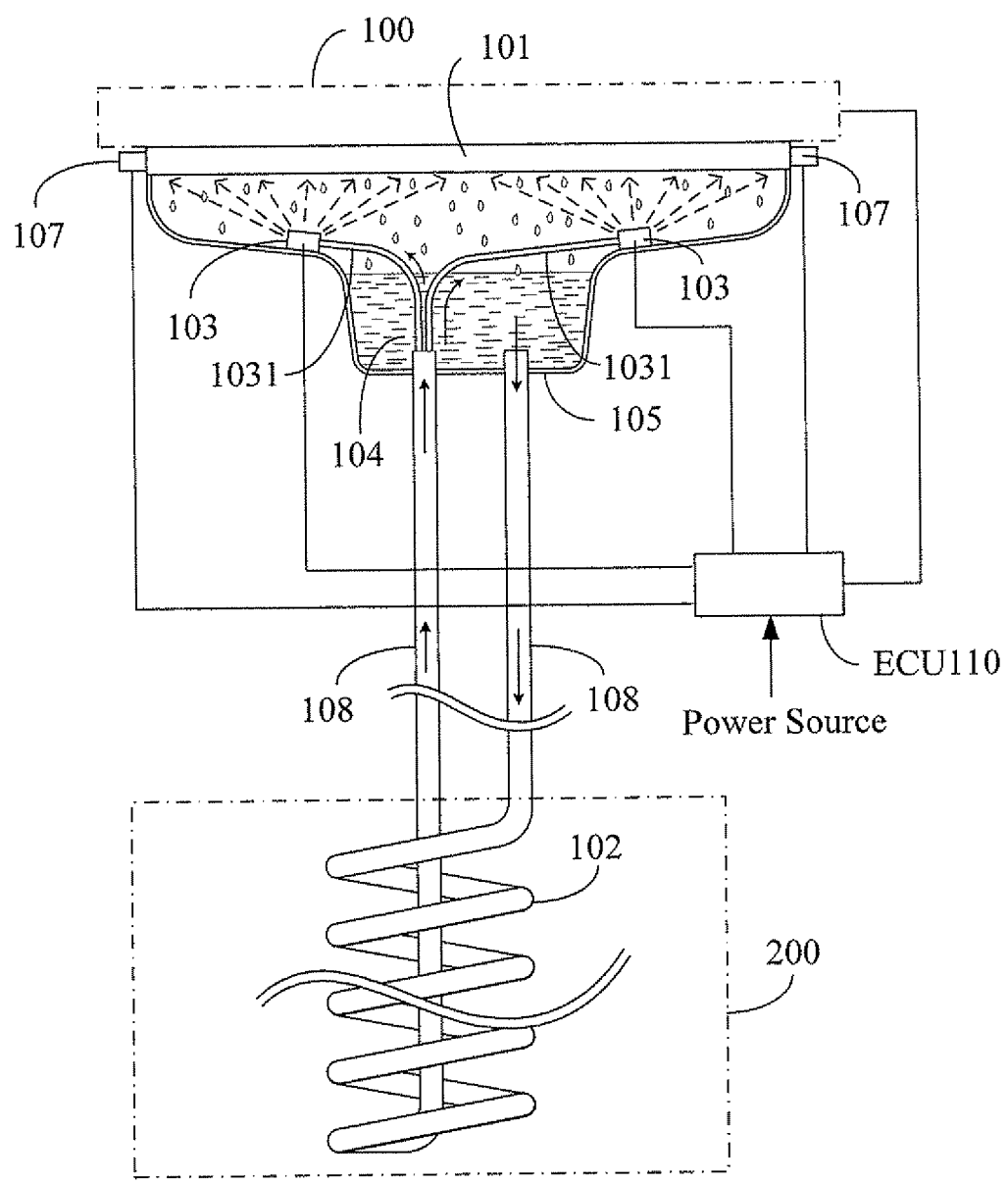
FIG. 2 is a schematic view showing the thermal conductive fluid (104) in the pipeline (108) of the temperature equalizing device (102) being directly introduced through the fluid introducing pipe (1031) of the fluid jetting device (103) and being jetted to the external thermal conduction interface structure of electrical equipment (101), then the thermal conductive fluid (104) being returned to the fluid collecting basin (105), and passed through the temperature equalizing device (102) installed in the natural thermal energy body (200), such that the thermal conductive fluid (104) being enabled to perform temperature equalizing and regulating through the temperature equalizing device (102) and the natural thermal energy body (200), then returned to the fluid collecting basin (105), according to one embodiment of the present invention.

FIG. 2 is a schematic view showing the thermal conductive fluid (104) in the pipeline (108) of the temperature equalizing device (102) being directly introduced through the fluid introducing pipe (1031) of the fluid jetting device (103) and being jetted to the external thermal conduction interface structure of electrical equipment (101), then the thermal conductive fluid (104) being returned to the fluid collecting basin (105), as well as passed through the temperature equalizing device (102) installed in the natural thermal energy body (200), so as to enable the thermal conductive fluid (104) to perform temperature equalizing and regulating with the natural thermal energy body (200) through the temperature equalizing device (102), then returned to the fluid collecting, basin (105), according to one embodiment of the present invention;

As shown in FIG. 2, it mainly consists of:

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Temperature equalizing device (102): constituted by a thermal conductive material in a desired geometric shape, and provided with a fluid inlet, a fluid outlet and a fluid pipeline for allowing the thermal conductive fluid (104) to pass through, so as to enable the passed thermal conductive fluid (104) to generate a temperature equalizing effect with the natural thermal energy body (200); the temperature equalizing device (102) can be replaced by a thermal conductive pipeline (108) having an sufficient length and being arranged to pass through the natural thermal energy body (200) for generating the function of temperature equalizing and regulating;

Fluid jetting device (103): constituted by one or more than one of fluid jetting devices being installed between the external thermal conduction interface structure of electrical equipment (101) and the fluid collecting basin (105), the fluid jetting device (103) is served to directly introduce the thermal conductive fluid (104) from the temperature equalizing device (102) via a fluid introducing pipe (1031) and jet the thermal conductive fluid (104) to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for storing the returned thermal conductive fluid (104) which is jetted by the fluid jetting device (103) to the external thermal conduction interface structure of electrical equipment (101), thereby the thermal conductive fluid (104) is driven by the operation of the fluid jetting device (103) and the thermal conductive fluid (104) in the fluid collecting basin (105) is enabled to pass through the pipeline (108) and the temperature equalizing device (102) installed in the natural thermal energy body (200) to mutually transfer the thermal energy with the natural thermal energy body (200); the structure between the fluid collecting basin (105) and the electric equipment (100) includes an opened, semi-opened or sealed structure;

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Pipeline (108): constituted by a pipeline structure allowing the thermal conductive fluid (104) to flow therein;

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pump (106) and the system operation; the function thereof is to control the operating timing of the fluid jetting device (103) for jetting the thermal conductive fluid (104) and the flow rate of the jetted thermal conductive fluid (104) according to the temperature detecting signals of the temperature detecting device (107) and the set system temperature values, thereby to enable the system being operated within the set temperature range; and when the system temperature is abnormal, the system is controlled to reduce the load of the electric equipment (100) or terminate the power supply.

According to the temperature equalization apparatus jetting fluid for thermal conduction used in an electrical equipment of the present invention, the conduction structure of the thermal conductive fluid (104) performing thermal conduction to the exterior can be further constructed by that the thermal conductive fluid (104) in the fluid collecting basin (105) is introduced through the fluid inlet of the fluid jetting device (103) so as to be jetted to the external thermal conduction interface structure of electrical equipment (101), then the thermal conductive fluid (104) is returned to the fluid collecting basin (105); a fluid pump (106) and a pipeline (108) are installed between the fluid collecting basin (105) and the temperature equalizing device (102) installed in the natural thermal energy body (200); and the thermal conductive fluid (104) in the fluid collecting basin (105) is pumped by the fluid pump (106) to pass through the temperature equalizing device (102) installed in the natural thermal energy body (200) via the pipeline (108), thereby to enable the thermal conductive fluid (104) to perform temperature equalizing and regulating with the natural thermal energy body (200) through the temperature equalizing device (102), then returned to the fluid collecting basin (105) thereby forming the circulation of the thermal conductive fluid (104);

The mentioned natural thermal energy body (200) can be a thermal storage member such as an earth surface, stratum, river, lake, artificial water channel or pipeline or pond.

Figure 3:
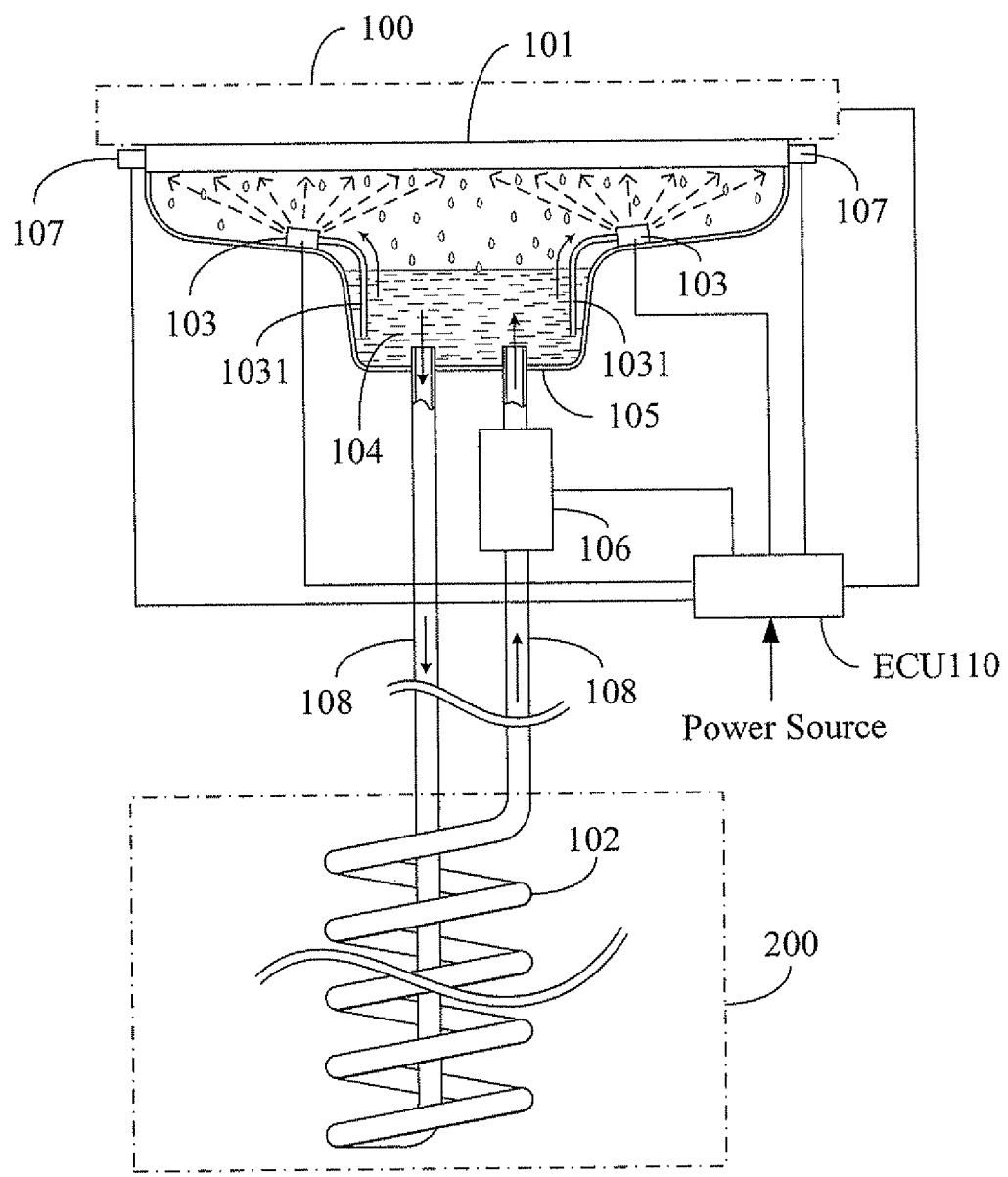
FIG. 3 is a schematic view showing the thermal conductive fluid (104) being pumped through the fluid pump (106) and via the pipeline (108) to pass through the temperature equalizing device (102) of the natural thermal energy body (200) so as to perform temperature equalizing and regulating to the natural thermal energy body (200), according to one embodiment of the present invention.

FIG. 3 is a schematic view showing the thermal conductive fluid (104) being pumped through the fluid pump (106) and the pipeline (108) to pass through the temperature equalizing device (102) installed in the natural thermal energy body (200) so as to perform temperature equalizing and regulating with the natural thermal energy body (200), according to one embodiment of the present invention;

As shown in FIG. 3, it mainly consists of

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Temperature equalizing device (102): constituted by a thermal conductive material in a desired geometric shape, and provided with a fluid inlet, a fluid outlet and a fluid pipeline for allowing the thermal conductive fluid (104) to pass through, so as to enable the passed thermal conductive fluid (104) to generate a temperature equalizing effect with the natural thermal energy body (200); the temperature equalizing device (102) can be replaced by a thermal conductive pipeline (108) having an sufficient length and being arranged to pass through the natural thermal energy body (200) for generating the function of temperature equalizing and regulating;

Fluid jetting device (103): constituted by one or more than one of fluid jetting devices being installed between the external thermal conduction interface structure of electrical equipment (101) and the fluid collecting basin (105), the fluid jetting device (103) is served to introduce the thermal conductive fluid (104) of the fluid collecting basin (105) via a fluid introducing pipe (1031) then jet the thermal conductive fluid (104) to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal is conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for collecting the returned thermal conductive fluid (104) which is jetted by the fluid jetting device (103) to the external thermal conduction interface structure of electrical equipment (101), the thermal conductive fluid (104) is pumped by the fluid pump (106) to pass through the temperature equalizing device (102) installed in the natural thermal energy body (200) via the pipeline (108) to mutually transfer the thermal energy with the natural thermal energy body (200); the structure between the fluid collecting basin (105) and the electric equipment (100) includes an opened, semi-opened or sealed structure;

Fluid pump (106): constituted by a fluid pump (106) driven by mechanical or electric force, and driven by the electric machineries such as a motor or an electromagnetic coil controlled by the control unit (ECU110) for pumping the thermal conductive fluid (104);

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Pipeline (108): constituted by a pipeline structure allowing the thermal conductive fluid (104) to flow therein;

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pump (106) and the system operation; the function thereof is to control the operating timing of the fluid jetting device (103) for jetting the thermal conductive fluid (104) and the flow rate of the jetted thermal conductive fluid (104), as well as to control the operating timing of the fluid pump (106) and the flow rate of the thermal conductive fluid (104) to be pumped between the temperature equalizing device (102) and the fluid collecting basin (105) according to the temperature detecting signals of the temperature detecting device (107) and the set system temperature values; thereby by means of controlling the operation timings of the fluid jetting device (103) and the fluid pump (106) and the flow rate of the pumped thermal conductive fluid (104), the system is operated within the set temperature range; and when the system temperature is abnormal, the system is controlled to reduce the load of the electric equipment (100) or terminate the power supply.

According to the temperature equalization apparatus jetting fluid for thermal conduction used in an electrical equipment of the present invention, the conduction structure of the thermal conductive fluid (104) performing thermal conduction to the exterior can further be constructed by that the thermal conductive fluid (104) in the fluid collecting basin (105) is introduced through the fluid inlet of the fluid jetting device (103) so as to be jetted to the external thermal conduction interface structure of electrical equipment (101), then the thermal conductive fluid (104) is returned to the fluid collecting basin (105) thereby forming the circulation of the thermal conductive fluid (104); and a heat exchanging device (120) immersed in the thermal conductive fluid (104) of the fluid collecting basin (105) is installed, the thermal conductive fluid (104) in the heat exchanging device (120) is pumped by a fluid pump (106) installed at the fluid outlet of the heat exchanging device (120) and passed through the temperature equalizing device (102) installed in the natural thermal energy body (200) via the pipeline (108), then returned to the heat exchanging device (120) through the fluid inlet of the heat exchanging device (120), so as to form the circulation of the thermal conductive fluid (104) between the heat exchanging device (120) and the temperature equalizing device (102), as well as to enable the thermal conductive fluid (104) to perform temperature equalizing and regulating with the natural thermal energy body (200) through the temperature equalizing device (102);

The mentioned natural thermal energy body (200) can be a thermal storage member such as an earth surface, stratum, river, lake, artificial water channel or pipeline or pond.

Figure 4:
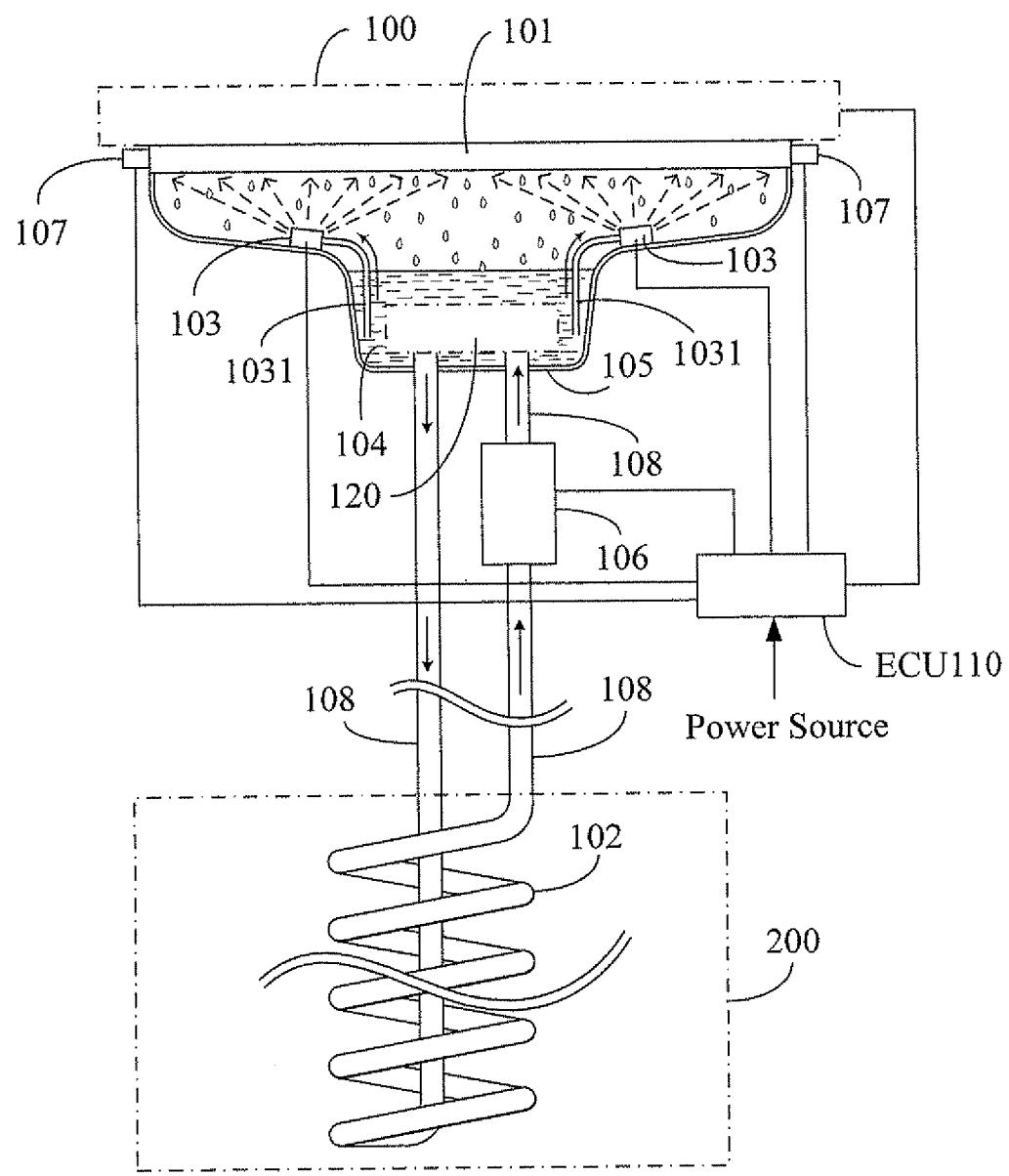
FIG. 4 is a schematic view showing the thermal conductive fluid (104) in the heat exchanging device (120) immersed in the thermal conductive fluid (104) of the fluid collecting basin (105), through installing the heat exchanging device (120) immersed in the thermal conductive fluid (104) of the fluid collecting basin (105), the fluid pump (106), the pipeline (108) and the temperature equalizing device (102), being pumped by the fluid pump (106) to pass through the temperature equalizing device (102) of the natural thermal energy body (200) via the pipeline (108) for performing temperature equalizing and regulating to the natural thermal energy body (200), according to one embodiment of the present invention.

FIG. 4 is a schematic view showing the thermal conductive fluid (104) in the heat exchanging device (120) immersed in the thermal conductive fluid (104) of the fluid collecting basin (105), through installing the heat exchanging device (120) immersed in the thermal conductive fluid (104) of the fluid collecting basin (105), the fluid pump (106), the pipeline (108) and the temperature equalizing device (102), being pumped by the fluid pump (106) to pass through the temperature equalizing device (102) of the natural thermal energy body (200) via the pipeline (108) for performing temperature equalizing and regulating to the natural thermal energy body (200), according to one embodiment of the present invention;

As shown in FIG. 4, it mainly consists of:

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Temperature equalizing device (102): constituted by a thermal conductive material in a desired geometric shape, and provided with a fluid inlet, a fluid outlet and a fluid pipeline for allowing the thermal conductive fluid (104) to pass through, so as to enable the passed thermal conductive fluid (104) to generate a temperature equalizing effect with the natural thermal energy body (200); the temperature equalizing device (102) can be replaced by a thermal conductive pipeline (108) having an sufficient length and being arranged to pass through the natural thermal energy body (200) for generating the function of temperature equalizing and regulating;

Fluid jetting device (103): constituted by one or more than one of fluid jetting devices being installed between the external thermal conduction interface structure of electrical equipment (101) and the fluid collecting basin (105), and the fluid jetting device (103) is served to introduce the thermal conductive fluid (104) of the fluid collecting basin (105) via a fluid introducing pipe (1031) then to jet the thermal conductive fluid (104) to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for collecting the returned thermal conductive fluid (104) which is jetted by the fluid jetting device (103) to the external thermal conduction interface structure of electrical equipment (101), and through installing a heat exchanging device (120) immersed in the thermal conductive fluid (104) of the fluid collecting basin (105), the thermal conductive fluid (104) in the heat exchanging device (120) immersed in the fluid collecting basin (105) is pumped by the fluid pump (106) to pass through the temperature equalizing device (102) installed in the natural thermal energy body (200) via the pipeline (108) to mutually transfer the thermal energy with the natural thermal energy body (200); the structure between the fluid collecting basin (105) and the electric equipment (100) includes an opened, semi-opened or sealed structure;

Fluid pump (106): constituted by a fluid pump (106) driven by mechanical or electric force, and driven by the electric machineries such as a motor or an electromagnetic coil controlled by the control unit (ECU110) for pumping the thermal conductive fluid (104);

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Pipeline (108): constituted by a pipeline structure allowing the thermal conductive fluid (104) to flow therein;

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pump (106) and the system operation; the function thereof is to control the operating timing of the fluid jetting device (103) for jetting the thermal conductive fluid (104) and the flow rate of the jetted thermal conductive fluid (104), as well as to control the operating timing of the fluid pump (106) and the flow rate of the thermal conductive fluid (104) to be pumped between the temperature equalizing device (102) and the fluid collecting basin (105) according to the temperature detecting signals of the temperature detecting device (107) and the set system temperature values; thereby by means of controlling the operation timings of the fluid jetting device (103) and the fluid pump (106) and the flow rate of the pumped thermal conductive fluid (104), the system is operated within the set temperature range; and when the system temperature is abnormal, the system is controlled to reduce the load of the electric equipment (100) or terminate the power supply;

Heat exchanging device (120): constituted by a thermal conductive material in a desired geometric shape, immersed in the thermal conductive fluid (104) in the fluid collecting basin (105) and installed with a fluid inlet, a fluid outlet and fluid pipelines for allowing the thermal conductive fluid (104) and the thermal conductive fluid (104) inside the fluid collecting basin (105) to mutually transfer the thermal energy.

Figure 5:
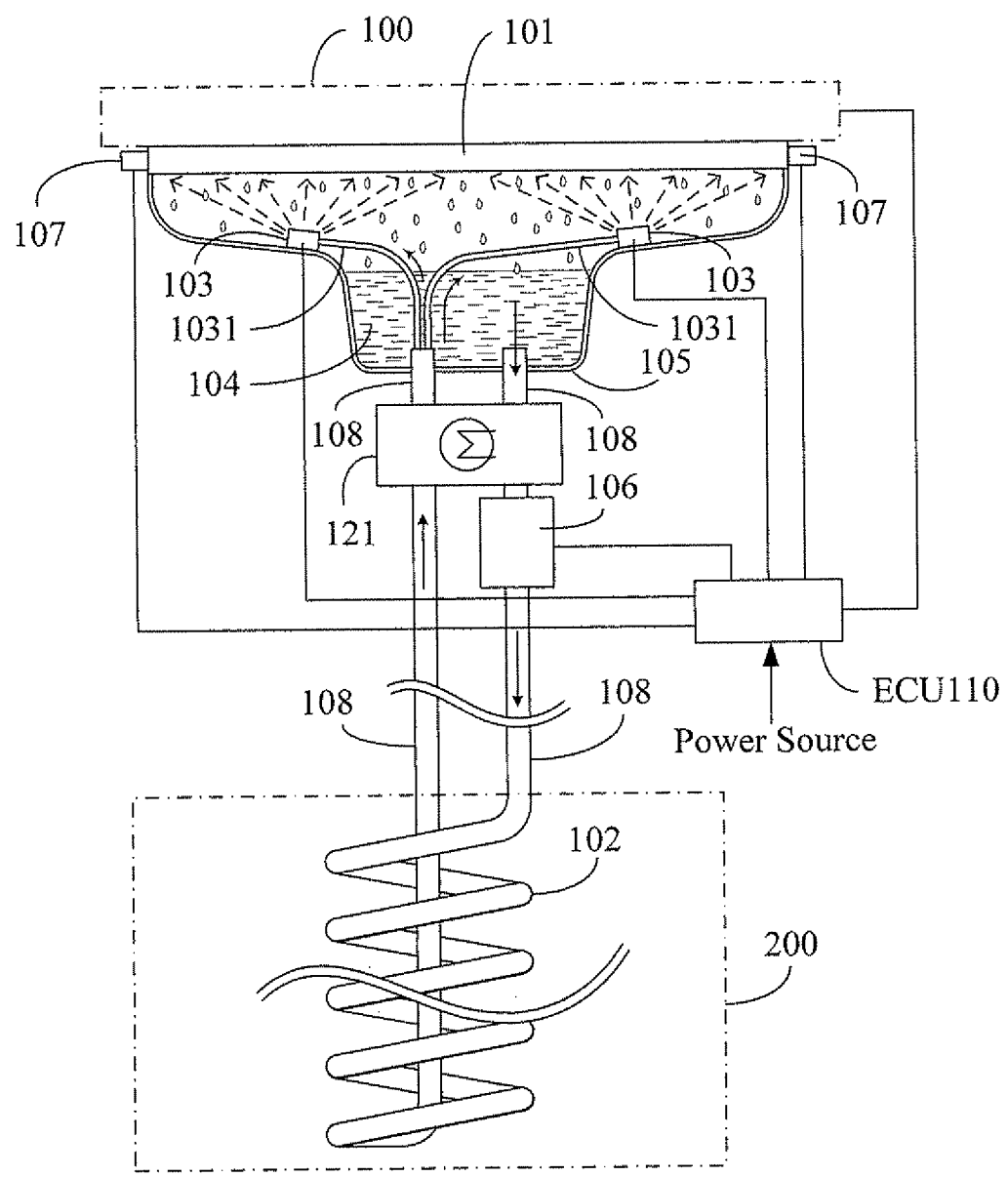
FIG. 5 is a schematic view showing the present invention being installed with the relay heat exchanging device (121), wherein the primary side thereof being communicated to the fluid collecting basin (105), the fluid pump (106) and the pipeline (108) being installed between the secondary side thereof and the temperature equalizing device (102) in the natural thermal energy body (200) for pumping the thermal conductive fluid (104) to pass through the temperature equalizing device (102) for performing temperature equalizing and regulating to the natural thermal energy body (200).

According to the temperature equalization apparatus jetting fluid for thermal conduction used in an electrical equipment of the present invention, the conduction structure of the thermal conductive fluid (104) conducting thermal energy to the exterior can further be constructed by that a relay heat exchanging device (121) is installed between the fluid collecting basin (105) and the temperature equalizing device (102), the fluid inlet at the primary side of the relay heat exchanging device (121) is communicated to the fluid collecting basin (105), the system operation is that the thermal conductive fluid (104) at the fluid outlet at the primary side of the relay heat exchanging device (121) is directly introduced through the fluid introducing pipe (1031) of the fluid jetting device (103) so as to be jetted to the external thermal conduction interface structure of electrical equipment (101), then the thermal conductive fluid (104) is returned to the fluid collecting basin (105) and further flowed to the fluid inlet at the primary side of the relay heat exchanging device (121), thereby forming the circulation of the thermal conductive fluid (104) at the primary side of the relay heat exchanging device (121); and a fluid pump (106) is installed between the fluid inlet and the fluid outlet at the secondary side of the relay heat exchanging device (121) and the temperature equalizing device (102) installed in the natural thermal energy body (200) for pumping the thermal conduction fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

The mentioned natural thermal energy body (200) can be a thermal storage member such as an earth surface, stratum, river, lake, artificial water channel or pipeline or pond;

FIG. 5 is a schematic view showing the present invention being installed with the relay heat exchanging device (121), wherein the primary side thereof being communicated to the fluid collecting basin (105), the fluid pump (106) and the pipeline (108) being installed between the secondary side thereof and the temperature equalizing device (102) installed in the natural thermal energy body (200) for pumping the thermal conductive fluid (104) to pass through the temperature equalizing device (102) for performing temperature equalizing and regulating to the natural thermal energy body (200);

As shown in FIG. 5, it mainly consists of:

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Temperature equalizing device (102): constituted by a thermal conductive material in a desired geometric shape, and provided with a fluid inlet, a fluid outlet and a fluid pipeline for allowing the thermal conductive fluid (104) to pass through, so as to enable the passed thermal conductive fluid (104) to generate a temperature equalizing effect with the natural thermal energy body (200); the temperature equalizing device (102) can be replaced by a thermal conductive pipeline (108) having an sufficient length and being arranged to pass through the natural thermal energy body (200) for generating the function of temperature equalizing and regulating;

Fluid jetting device (103): constituted by one or more than one of fluid jetting devices being installed between the external thermal conduction interface structure of electrical equipment (101) and the fluid collecting basin (105), wherein the thermal conductive fluid (104) from the fluid outlet at the primary side of the relay heat exchanging device (121) is directly introduced through a fluid introducing pipe (1031) of the fluid jetting device (103) then jetted to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for collecting the returned thermal conductive fluid (104) which is jetted by the fluid jetting device (103) to the external thermal conduction interface structure of electrical equipment (101), so as to via the pipeline (108) to pump the thermal conductive fluid (104) into the fluid inlet at the primary side of the relay heat exchanging device (121); the structure between the fluid collecting basin (105) and the electric equipment (100) includes an opened, semi-opened or sealed structure;

Fluid pump (106): constituted by a fluid pump (106) driven by mechanical or electric force, and driven by the electric machineries such as a motor or an electromagnetic coil controlled by the control unit (ECU110) for pumping the thermal conductive fluid (104);

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Pipeline (108): constituted by a pipeline structure allowing the thermal conductive fluid (104) to flow therein;

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pump (106) and the system operation; the function thereof is to control the operating timing of the fluid jetting device (103) for jetting the thermal conductive fluid (104) and the flow rate of the jetted thermal conductive fluid (104), as well as to control the operating timing of the fluid pump (106) and the flow rate of the thermal conductive fluid (104) to be pumped between the temperature equalizing device (102) and the fluid collecting basin (105) according to the temperature detecting signals of the temperature detecting device (107) and the set system temperature values; thereby by means of controlling the operation timings of the fluid jetting device (103) and the fluid pump (106) and the flow rate of the pumped thermal conductive fluid (104), the system is operated within the set temperature range; and when the system temperature is abnormal, the system is controlled to reduce the load of the electric equipment (100) or terminate the power supply;

Relay heat exchanging device (121): constituted by a thermal conductive material in a desired geometric shape, having a primary side pipeline and a secondary side pipeline, wherein a fluid inlet at the primary side for passing the thermal conductive fluid (104) is communicated to the fluid collecting basin (105), and a fluid outlet at the primary side is communicated to the fluid jetting device (103); a fluid pump (106) is installed between the secondary side pipeline and the temperature equalizing device (102) for forming a closed pipeline so as to pump the thermal conductive fluid (104) to circulatively flow in the pipeline (108).

Figure 6:
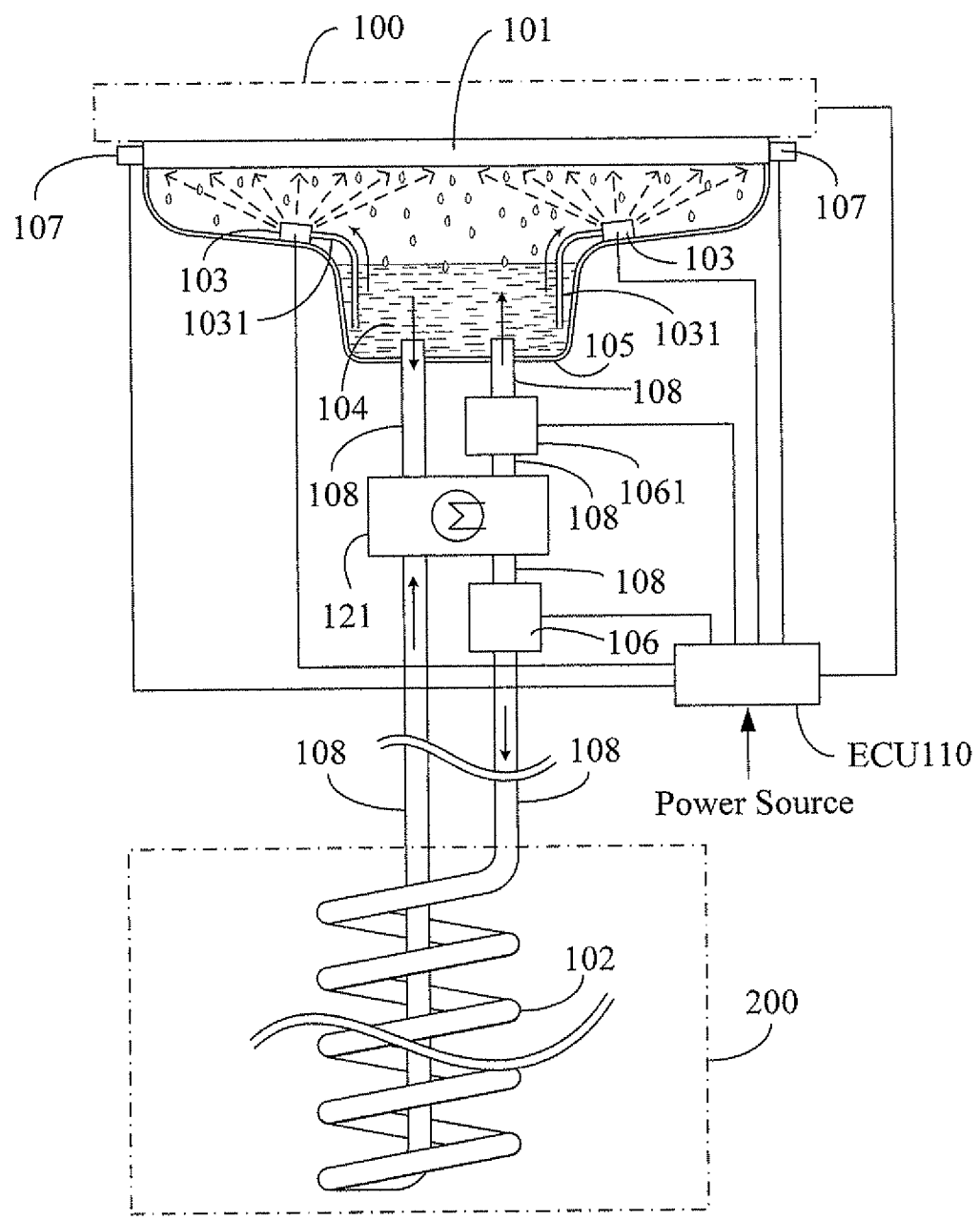
FIG. 6 is a schematic view showing the present invention being installed with the relay heat exchanging device (121), the primary side thereof being installed with the pipeline (108) and a fluid pump (1061) for pumping the thermal conductive fluid (104) at the primary side to the fluid collecting basin (105), the fluid pump (106) and the pipeline (108) being installed between the secondary side thereof and the temperature equalizing device (102) in the natural thermal energy body (200) for pumping the thermal conductive fluid (104) to pass through the temperature equalizing device (102), so as to perform temperature equalizing and regulating to the natural thermal energy body (200).

According to the temperature equalization apparatus jetting fluid for thermal conduction used in an electrical equipment of the present invention, the conduction structure of the thermal conductive fluid (104) conducting thermal energy to the exterior can further be constructed by that a relay heat exchanging device (121) is installed between the fluid collecting basin (105) and the temperature equalizing device (102), and the system operation is that the thermal conductive fluid (104) of the fluid collecting basin (105) is introduced through the fluid inlet of the fluid jetting device (103) so as to be jetted to the external thermal conduction interface structure of electrical equipment (101), then the thermal conductive fluid (104) is returned to the fluid collecting basin (105) for forming the circulation of the thermal conductive fluid (104); a fluid pump (1061) and a pipeline (108) are installed between the fluid outlet at the primary side of the relay heat exchanging device (121) and the fluid collecting basin (105) for pumping the thermal conductive fluid (104) at the primary side to return to the fluid collecting basin (105) via the pipeline (108) so as to form the circulation of the thermal conductive fluid (104) at the primary side; and a fluid pump (106) is installed between the fluid inlet and the fluid outlet at the secondary side of the relay heat exchanging device (121) and the temperature equalizing device (102) installed in the natural thermal energy body (200) for pumping the thermal conduction fluid (104) to pass through the temperature equalizing device (102) via the pipeline (108) then returned to the secondary side of the relay heat exchanging device (121), thereby to form the circulation of the thermal conductive fluid (104) between the secondary side of the relay heat exchanging device (121) and the temperature equalizing device (102), as well as to enable the thermal conductive fluid (104) to perform temperature equalizing and regulating with the natural thermal energy body (200) through the temperature equalizing device (102);

The mentioned natural thermal energy body (200) can be a thermal storage member such as an earth surface, stratum, river, lake, artificial water channel or pipeline or pond;

FIG. 6 is a schematic view showing the present invention being installed with the relay heat exchanging device (121), wherein the primary side thereof being installed with the pipeline (108) and a fluid pump (1061) for pumping the thermal conductive fluid (104) at the primary side to the fluid collecting basin (105), and the fluid pump (106) and the pipeline (108) being installed between the secondary side thereof and the temperature equalizing device (102) installed in the natural thermal energy body (200) for pumping the thermal conductive fluid (104) to pass through the temperature equalizing device (102), so as to perform temperature equalizing and regulating to the natural thermal energy body (200);

As shown in FIG. 6, it mainly consists of:

Electric equipment (100): including an electric equipment made of solid or gaseous semiconductors, or an electric equipment composed of electric machineries and electric controls, wherein the electric equipment made of solid or gaseous semiconductors includes semiconductors combined on a heat dissipation device, or packaged semiconductors, or semiconductors combined on a heat dissipation device then packaged; the heat dissipation device combined with the semiconductors includes a heat dissipation device in a liquid state or gaseous state or solid state or having heat pipes; the types of the semiconductors in the semiconductor equipment can include one or more than one of the followings: different types of light emitting diodes (LEDs), a light emitting device of gaseous semiconductor for converting electric energy into optical energy, a photovoltaic or concentrating photovoltaic for converting optical energy into electric energy, a power transistor, a rectify diode, a thyristor, a metal oxide semiconductor field effect transistor (MOSFET), an insulated gate bipolar transistor (IGBT), a gate turn-off thyristor (GTO), a silicon controlled rectifier (SCR), a triode for alternating current (TRIAC), a linear transistor, and different types of integrated circuits of semiconductor, memory, central process unit (CPU) or a server;

The electric equipment composed of electric machineries or electric controls includes a power supply, an adapter, an electric resistor, a static electric machinery, a motor, a power generator, a turbine transmission device, a revolving electric machinery, an electric machinery driven control device, a converter, an inverter, an electric charging device, a power control device or an electromagnetic control device;

External thermal conduction interface structure of electrical equipment (101): constituted by an external thermal conduction structure of the electric equipment (100), the surface thereof is provided with a property of being compatible with the thermal conductive fluid (104) and corrosion proof, and provided with an anti-moist structure or an anti-moist layer;

The mentioned external thermal conduction interface structure of electrical equipment (101) can be horizontally, vertically or obliquely installed for allowing the thermal conductive fluid (104) jetted from the fluid jetting device (103) to return to the fluid collecting basin (105);

Temperature equalizing device (102): constituted by a thermal conductive material and structure in a desired geometric shape for allowing the thermal conductive fluid (104) to pass through, so as to enable the passed thermal conductive fluid (104) to generate a temperature equalizing effect with the natural thermal energy body (200); the temperature equalizing device (102) can be replaced by a thermal conductive pipeline (108) having an sufficient length and being arranged to pass through the natural thermal energy body (200) for generating the function of temperature equalizing and regulating;

Fluid jetting device (103): constituted by one or more than one of fluid jetting devices being installed between the external thermal conduction interface structure of electrical equipment (101) and the fluid collecting basin (105), and the fluid jetting device (103) is through a fluid introducing pipe (1031) to introduce the thermal conductive fluid (104) from the fluid collecting basin (105) then to jet to the external thermal conduction interface structure of electrical equipment (101); the fluid jetting device (103) is driven through mechanical force, electric force or ultrasonic to jet out the introduced liquid thermal conductive fluid (104), or to jet out the gaseous thermal conductive fluid (104);

Thermal conductive fluid (104): constituted by a fluid which is a liquid while being in the normal state and having a thermal conductive function, and after being jetted by the fluid jetting device (103), the thermal conductive fluid (104) is in a liquid, particle liquid or mist or gaseous state, or the thermal conductive fluid (104) is converted into a gaseous state from a liquid state or converted into a liquid from a gaseous state;

Fluid collecting basin (105): installed at the bottom side of the electric equipment (100) for collecting the returned thermal conductive fluid (104) which is jetted by the fluid jetting device (103) to the external thermal conduction interface structure of electrical equipment (101); and via the pipeline (108), the thermal conductive fluid (104) is pumped by the fluid pump (106) to pass through the inlet of the pipeline (108) at the primary side of the relay heat exchanging device (121) then returned to the fluid collecting basin (105) through the outlet; the structure between the fluid collecting basin (105) and the electric equipment (100) includes an opened, semi-opened or sealed structure;

Fluid pump (106, 1061): constituted by a fluid pump driven by mechanical or electric force, and driven by the electric machineries such as a motor or an electromagnetic coil controlled by the control unit (ECU110) for pumping the thermal conductive fluid (104);

Temperature detecting device (107): constituted by one or more than one of physical or chemical temperature detecting devices capable of detecting the temperature changes, and is installed on the electric equipment (100) or the external thermal conduction interface structure of electrical equipment (101), so as to provide temperature indications or to provide control signals feedback to a control unit (ECU110);

Pipeline (108): constituted by a pipeline structure allowing the thermal conductive fluid (104) to flow therein;

Control unit (ECU110): constituted by electric machineries, solid electric circuits and relative software, for receiving the electric power of a power source, e.g. the electric power from the public power source or an electric energy storing device, or the electric energy from renewable energy source e.g. a wind power generator, photovoltaic or concentrating photovoltaic which converts optical energy into electric energy for driving the fluid pumps (106, 1061) and the system operation; the function thereof is to control the operating timing of the fluid jetting device (103) for jetting the thermal conductive fluid (104) and the flow rate of the jetted thermal conductive fluid (104), as well as to control the operating timing of the fluid pump (106, 1061) and the flow rate of the thermal conductive fluid (104) to be pumped between the temperature equalizing device (102) and the secondary side of the relay heat exchanging device (121) according to the temperature detecting signals of the temperature detecting device (107) and the set system temperature values; thereby by means of controlling the operation timings of the fluid jetting device (103) and the fluid pumps (106, 1061) and the flow rate of the pumped thermal conductive fluid (104), the system is operated within the set temperature range; and when the system temperature is abnormal, the system is controlled to reduce the load of the electric equipment (100) or terminate the power supply;

Relay heat exchanging device (121): constituted by a thermal conductive material in a desired geometric shape, having a primary side pipeline and a secondary side pipeline, wherein a fluid inlet at the primary side for passing the thermal conductive fluid (104) is communicated to the fluid collecting basin (105), and installed with a fluid pump (1061) and a pipeline (108) for pumping the thermal conductive fluid (104) to the fluid collecting basin (105) for forming the circulation of the thermal conductive fluid (104) of the primary side; a fluid pump (106) is installed between the pipeline (108) at the secondary side and the temperature equalizing device (102) for forming a closed pipeline (108) so as to pump the thermal conductive fluid (104) to circulatively flow in the pipeline (108).

Figure 7:
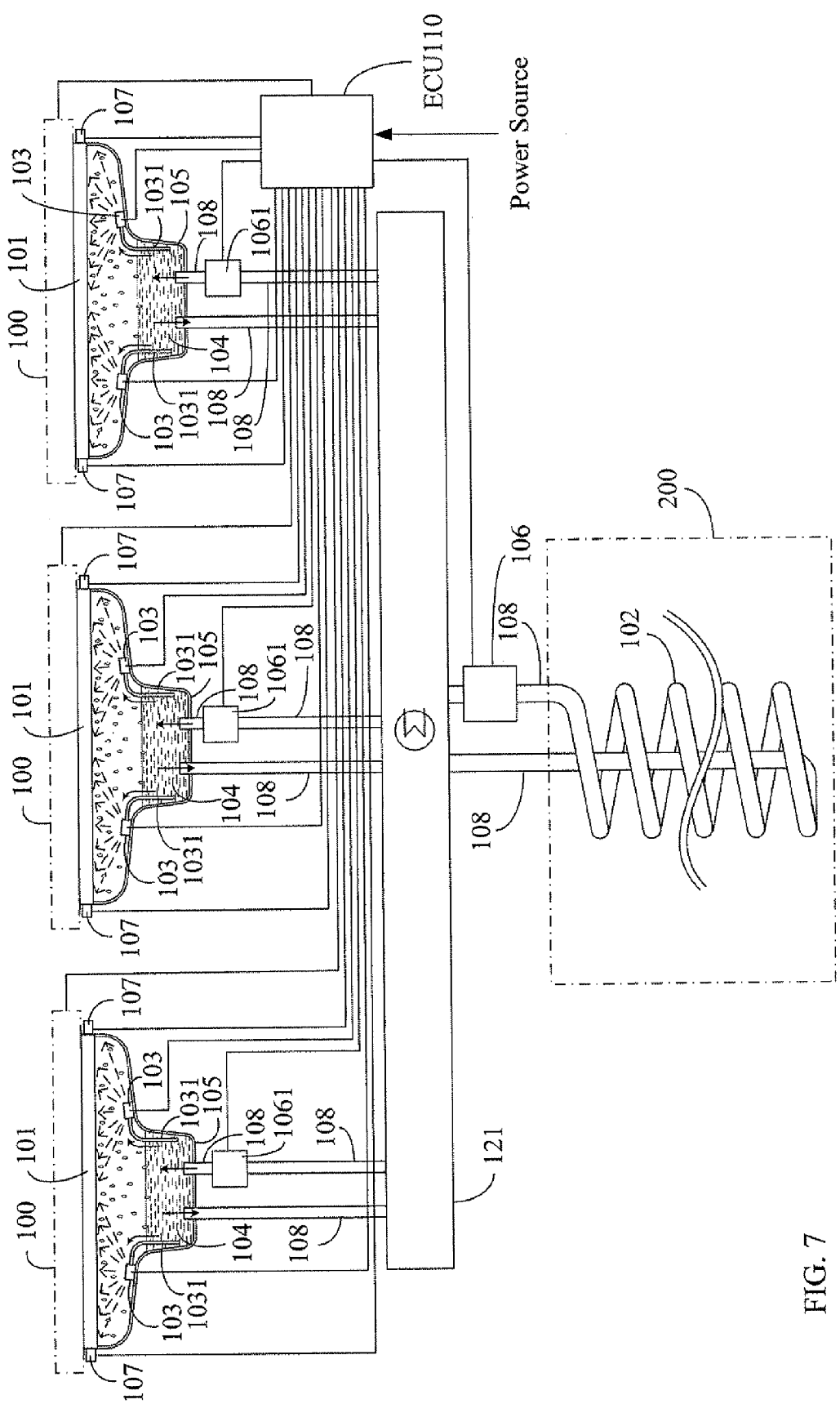
FIG. 7 is a schematic view showing the thermal conductive fluids (104) in the individual fluid collecting basins (105) being conveyed towards the primary side of the relay heat exchanging device (121) through the individual fluid pumps (1061) and pipelines (108).

According to the temperature equalization apparatus jetting fluid for thermal conduction used in an electrical equipment of the present invention, the thermal conductive fluids (104) in two and more than two of the fluid collecting basins (105) can be communicated towards the primary side of the relay heat exchanging device (121) through individual fluid pumps (1061) and pipelines (108);

FIG. 7 is a schematic view showing the thermal conductive fluids (104) in the individual fluid collecting basins (105) being communicated towards the primary side of the relay heat exchanging device (121) through the individual fluid pumps (1061) and pipelines (108);

As shown in FIG. 7, the structuring method is that a fluid pump (1061) and a pipeline (108) are respectively installed between individual fluid collecting basin (105) and the relay heat exchanging device (121), and connected to the primary side of the replay heat exchanging device (121) in parallel or in series.

Figure 8:
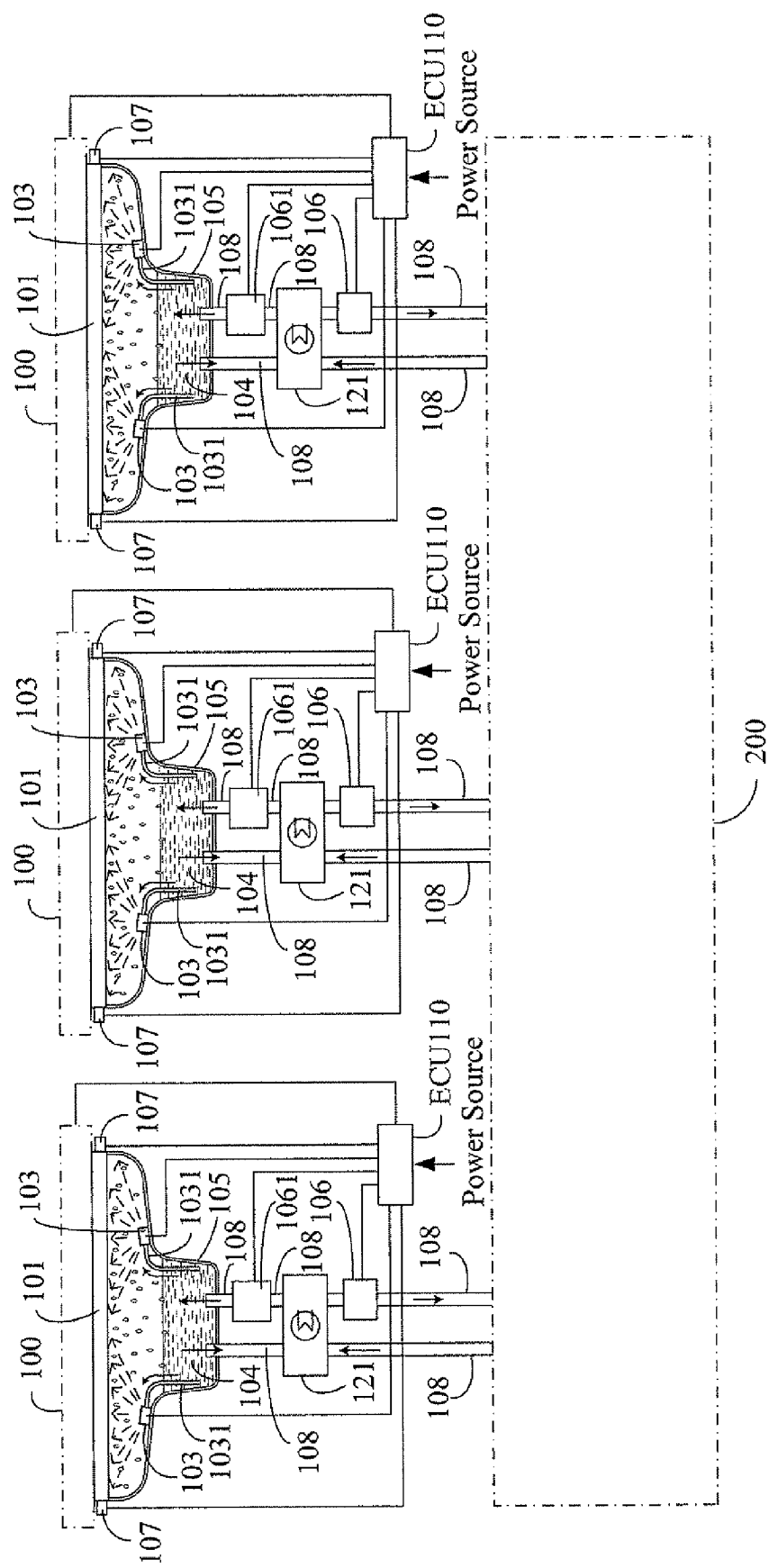
FIG. 8 is a schematic view showing the secondary sides of individual relay heat exchanging devices (121) being connected to the shared temperature equalizing device (102).

According to the temperature equalization apparatus jetting fluid for thermal conduction used in an electrical equipment of the present invention, secondary sides at two or more than two relay heat exchanging devices (121) can be connected to the shared temperature equalizing device (102);

FIG. 8 is a schematic view showing the secondary sides of individual relay heat exchanging devices (121) being connected to the shared temperature equalizing device (102);

As shown in FIG. 8, the structuring method is that a fluid pump (106) and pipelines are respectively installed between the secondary side of individual relay heat exchanging device (121) and the temperature equalizing device (102) for being connected between the secondary sides of the relay heat exchanging devices (121) and the temperature equalizing device (102) in parallel or in series.

The invention claimed is:
1. A temperature equalization apparatus, comprising:
at least one fluid jetting device (103) for jetting a thermally conductive fluid (104) by directing a jet of the thermally conductive fluid (104) upwardly toward an external thermal conduction interface structure (101) of an electrical equipment (100), said thermally conduc- tive fluid exchanging heat with the thermal conduction interface structure to conduct heat away from the electrical equipment (100);

a fluid collecting basin (105) for collecting the thermal conductive fluid (104) after it has exchanged heat with the thermal conduction interface structure (101);

a fluid introducing pipe (1031) extending from within said fluid collecting basin (105) to the fluid jetting device (103) for returning the thermally conductive fluid (104) to the fluid jetting device (103), thereby circulating the thermal conductive fluid (104) between the jetting device (103), the thermal conduction interface structure (101), and the fluid collecting basin (105); and a temperature equalizing device (102) installed in a natural thermal energy body (200) and connected to the fluid connecting basin (105) by a pipeline (108), said pipeline (108) supplying said thermal conducting fluid (104) from the fluid collecting basin (105) to the temperature equalizing device (102), wherein thermal energy acquired by the thermal conductive fluid (104) from the external thermal conduction interface structure (101) is dissipated in said natural thermal energy body (200), and wherein the fluid jetting device (103) is at least one of an electrical, mechanical, and ultrasonic device for drawing, without a pump, said thermal conductive fluid from the fluid collecting basin (105) or the pipeline (108) and applying an upwardly directed jetting force to the thermally conductive fluid, and is installed between the fluid collecting basin (105) and the external thermal conduction interface structure (101) of the electric equipment (100).

2. A temperature equalization apparatus as claimed in claim 1, wherein the fluid jetting device (103) injects the fluid in a small particle or fine mist state to a surface of the thermal conduction interface structure (101), such that the fluid in the small particle or fine mist state is accelerated as it is injected, thereby forcing a gaseous fluid that has already been evaporated away from the surface of the external thermal conduction interface structure (101).

3. A temperature equalization apparatus as claimed in claim 1, wherein the fluid injecting device (103) is one of a dry-expansion type evaporator, a flooded type evaporator, a spray type evaporator, and a falling type evaporator.

4. A temperature equalization apparatus as claimed in claim 1, wherein said pipeline (108) supplies said thermal conducting fluid (104) from the fluid collecting basin (105) to the temperature equalizing device (102) and from the temperature equalizing device (102) to the fluid introducing pipe (1031), the fluid introducing pipe (1031) supplying said thermal conductive fluid (104) directly from the pipeline (108) to the fluid jetting device (103).

5. A temperature equalization apparatus as claimed in claim 4, wherein said pipeline (108) supplies said thermal conducting fluid (104) from the fluid collecting basin (105) to the temperature equalizing device (102) and from the temperature equalizing device (102) back to the fluid collecting basin (105).

6. A temperature equalization apparatus as claimed in claim 5, further comprising a fluid pump (106) for pumping said thermal conducting fluid (104) through said pipeline (108) and thermal equalizing device (102).

7. A temperature equalization apparatus as claimed in claim 5, further comprising a heat exchanging device (120) positioned in the fluid collecting basin (105) and immersed in said thermal conduction fluid (104), said pipeline (108) having an inlet and an outlet respectively connected to the heat exchanging device (120) for circulating said thermal conduction fluid (104) from the fluid collecting basin (105) through the heat ex/changing device (120) and the pipeline (108) to the thermal equalizing device (102) and back through the pipeline (108) and heat exchanging device (120) to the fluid collecting basin (105).

8. A temperature equalization apparatus as claimed in claim 1, further comprising a relay heat exchanging device (121) installed between the fluid collecting basin (105) and the temperature equalizing device (102), said relay heat exchanging device (121) having a primary side fluid inlet connected to the fluid collecting basin (105) by said pipeline (108) and a primary side fluid outlet, wherein said primary side fluid outlet of the relay heat exchanging device (121) is connected to said jetting device (103) by said pipeline (108) and by a fluid introducing pipe (1031) that directly connects the pipeline (108) and the jetting device (103), and wherein a fluid pump (106) and said temperature equalizing device (102) are installed in said pipeline (108) between a secondary side fluid inlet and a secondary side fluid outlet of the relay heat exchanging device (121).

9. A temperature equalization apparatus as claimed in claim 1, further comprising a relay heat exchanging device (121) installed between the fluid collecting basin (105) and the temperature equalizing device (102), said relay heat exchanging device (121) having a primary side fluid inlet and a primary side fluid outlet connected to the fluid collecting basin (105) by said fluid pipeline (108), wherein a fluid pump (106) and said temperature equalizing device (102) are installed in the fluid pipeline (108) between a secondary side fluid inlet and a secondary side fluid outlet of the relay heat exchanging device (121), and wherein the fluid collecting basin (105) is connected to the jetting device (103) by a fluid introducing pipe (1031).

10. A temperature equalization apparatus as claimed in claim 9, further comprising a second fluid pump (1061) installed in said pipeline (108) between said relay heat exchanging device (121) and said fluid collecting basis (105).

11. A temperature equalization apparatus as claimed in claim 9, wherein said relay heat exchanging device (121) is installed between the temperature equalizing device (102) and a plurality of said fluid collecting basins (105), fluid jetting devices (103), external conductive interface structures (101), and electronic equipment (100).

12. A temperature equalization apparatus as claimed in claim 9, wherein said temperature equalizing device (102) is connected to a plurality of said relay heat exchanging devices (121), fluid collecting basins (105), fluid jetting devices (103), external conductive interface structures (101), and electronic equipment (100).

13. A temperature equalization apparatus as claimed in claim 1, wherein said natural thermal energy body (200) is one of an earth surface, earth stratum, river, lake, artificial water channel, pipeline, and pond.

14. A temperature equalization apparatus as claimed in claim 1, wherein the electrical equipment (100) includes at least one of the following: a light-emitting device including light emitting diodes (LEDs) for converting electric energy into optical energy, a photovoltaic or concentrating photovoltaic device for converting optical energy into electric energy, a photoelectric device, a transistor, a diode, a thyristor, a silicon controlled rectifier, a triode, an integrated circuit, a memory, a central processing unit, and a server.

15. A temperature equalization apparatus as claimed in claim 1, wherein the electrical equipment (100) includes electric equipment composed of electric machinery, said electric machinery including at least one of a power supply, adapter, resistor, static electrical machine, motor, power generator, turbine transmission device, revolving electrical machine, electrical machinery driven control device, converter, inverter, electric charging device, power control device, and electromagnetic control device.

16. A temperature equalization apparatus as claimed in claim 1, wherein the thermal conductive fluid (104) is in a liquid state after being jetted and returned to the fluid collecting basin (105), is supplied to the fluid jetting device (103) in a fluid or gaseous state, and is converted by the fluid jetting device (103) into one of a liquid, particles, mist, and gas.

17. A temperature equalization apparatus as claimed in claim 1, further comprising a temperature detecting device (107) connected to a control unit (ECU110), said control unit (ECU110) being connected to said fluid jetting device (103) to control jetting of said thermal conductive fluid (104) towards the external thermal conductive interface structure (101) in response to temperature feedback from said temperature detecting device (107).

18. A temperature equalization apparatus as claimed in claim 17, wherein said control unit (ECU110) is further connected to the electric equipment (100) to reduce a load of the electric equipment (100) or terminate a power supply to the electric equipment in response to feedback from said temperature detection device (107).

19. A temperature equalization apparatus as claimed in claim 1, wherein the fluid jetting device (103) is driven by one of mechanical, electrical, and ultrasonic force to form said thermal conductive fluid (104) into a jet directed at said external thermal conductive interface structure (101).

20. A temperature equalization apparatus as claimed in claim 1, wherein thermal energy acquired by the thermal conductive fluid (104) from the external thermal conduction interface structure (101) is dissipated via a housing of said fluid collecting basin (105).

21. A temperature equalization apparatus as claimed in claim 1, wherein the electrical equipment (100) includes at least one of the following: a gas lighting device, a linear transistor, a Metal Oxide Semiconductor Field Effect Translator (MOSFET), an Insulated Gate Bipolar Transistor (IGBT), an Integrated Circuit having a memory, a central processing unit, and a server; a Gate Turn-Off thyrister (GTO), a Silicon Controlled Rectifier(SCR), and a Triode for Alternating Current (TRIAC).

* * * * *